United States Patent [19]
Golke et al.

[11] Patent Number: 6,058,041
[45] Date of Patent: May 2, 2000

[54] SEU HARDENING CIRCUIT

[75] Inventors: Keith W. Golke, Minneapolis; Paul S. Fechner, Plymouth, both of Minn.

[73] Assignee: Honeywell Inc., Morristown, N.J.

[21] Appl. No.: 09/219,807

[22] Filed: Dec. 23, 1998

[51] Int. Cl.[7] .................................................. G11C 11/00
[52] U.S. Cl. ........................... 365/156; 365/154; 365/175
[58] Field of Search ..................................... 365/156, 154, 365/175; 275/373

[56] References Cited

U.S. PATENT DOCUMENTS

| | | | |
|---|---|---|---|
| 4,725,981 | 2/1988 | Rutledge | 365/154 |
| 4,797,804 | 1/1989 | Rockett, Jr. | 365/154 |
| 4,912,675 | 3/1990 | Blake et al. | 365/154 |
| 5,406,513 | 4/1995 | Canaris et al. | 365/156 X |
| 5,536,960 | 7/1996 | Haysahi | 365/154 X |
| 5,631,863 | 5/1997 | Fechner et al. | 365/156 |

OTHER PUBLICATIONS

Andrews, J.L. et al., "Single Event Error Immune CMOS RAM," *IEEE Transactions on Nuclear Science*, vol. NS–29, No. 6, Dec. 1982, pp. 2040–2043.

Calin, T. et al., "Upset Hardened Memory Design for Submicron CMOS Technology," *IEEE Transactions on Nuclear Science*, vol. 43, No. 6, Dec. 1996, pp. 2874–2878.

Chen, Chao–Cheng et al., "A Circuit Design for the Improvement of Radiation Hardness in CMOS Digital Circuits," *IEEE Transactions on Nuclear Science*, vol. 39, No.2, Apr. 1992, pp. 272–277.

Diehl, S.E. et al., "Considerations for Single Event Immune VLSI Logic," *IEEE Transactions on Nuclear Science*, vol. NS–30, No. 6, Dec. 1983, pp. 4501–4507.

Giddings, Alfred E., "Single Event Upset Immune Integrated Circuits for Project Galileo," *IEEE Transactions on Nuclear Science*, vol. NS–32, No. 6, Dec. 1985, pp. 4159–4163.

Golke, K.W. et al., "Test Results of a SEU Hardened 8T Memory Cell for a 1M SRAM," *Journal of Radiation Effects*, vol. 13, No. 1, Jan. 1996, pp. 99–105.

Hauser, John R., "SEU–Hardened Silicon Bipolar and GaAs MESFET SRAM Cells Using Local Redundancy Techniques," *IEEE Transactions on Nuclear Science*, vol. 39, No.1, Feb. 1992, pp. 2–6.

Johnson, Richard L. Jr. et al., "An Improved Single Event Resistive–Hardening Technique for CMOS Static RAMs," *IEEE Transactions on Nuclear Science*, vol. NS–33, No. 6, Dec. 1986, pp. 1730–1733.

Liu, M. Norley et al., "Low Power SEU Immune CMOS Memory Circuits," *IEEE Transactions on Nuclear Science*, vol. 39, No. 6, Dec. 1992, pp. 1679–1684.

Massengill, Lloyd W., "SEU–Hardened Resistive–Load Static RAMs," *IEEE Transactions on Nuclear Science*, vol. 38, No. 6, Dec. 1991, pp. 1478–1485.

Rockett, Jr., "Simulated SEU Hardened Scaled CMOS SRAM Cell Design Using Gated Resistors," *IEEE Transactions on Nuclear Science*, vol. 39, No. 5, Oct. 1992, pp. 1532–1541.

Velazco, R. et al., "Two CMOS Memory Cells Suitable for the Design of SEU–Tolerant VLSI Circuits," *IEEE Transactions on Nuclear Science*, vol. 41, No. 6, Dec. 1994, pp. 2229–2234.

Weaver, H.T. et al., "An SEU Tolerant Memory Cell Derived From Fundamental Studies of SEU Mechanisms in SRAM," *IEEE Transactions on Nuclear Science*, vol. NS–34, No., 6, Dec. 1987, pp. 1281–1286.

Whitaker, Sterling et al., "SEU Hardened Memory Cells for a CCSDS Reed Solomon Encoder," *IEEE Transactions on Nuclear Science*, vol. 38, No. 6, Dec. 1991, pp. 1471–1477.

*Primary Examiner*—Huan Hoang
*Attorney, Agent, or Firm*—Kris T. Fredrick

[57] ABSTRACT

A SEU hardening circuit for use with a data storage circuit is described. The SEU hardening circuit may use a transmission gate to provide full rail drive during a write operation. The SEU hardening circuit may also be configured so that the transistors of the SEU hardening circuit are not susceptible to parasitic bipolar turn-on particularly during a radiation event, which can increase the SEU protection provided by the circuit.

22 Claims, 9 Drawing Sheets

SEU HARDENING CIRCUIT

SEU HARDENING CIRCUIT

This application is related to co-pending U.S. patent application Ser. No. 09/219,804, filed Dec. 23, 1998, and entitled "Integrated Circuit Impedance Device And Method Of Manufacture Therefor", which is incorporated herein by reference.

BACKGROUND OF THE INVENTION

The present invention relates to integrated circuit data storage circuits, and more particularly, to SEU hardening circuits for use with integrated circuit data storage circuits. The military and orbital/interplanetary space markets have created a need for electronic systems that can operate in high radiation environments. Most applications for these systems also require high performance, high complexity, high density, and very low power. This produces a need for state-of-the-art technologies that are radiation hardened, i.e., have a tolerance or immunity to radiation effects. Other equivalent phrases include radiation hard or rad-hard.

Radiation can interact with many semi-conductor materials, including silicon based semi-conductor materials. These interactions can cause undesirable effects during circuit operation. For example, radiation can change the conductance of a MOS transistor by changing the threshold voltage ($V_t$). Many of these undesirable effects can be minimized by using a radiation hardened process. However, in Very Large Scale Integration (VLSI) circuits, radiation can also generate significant levels of transient voltage and current disturbances on internal nodes, including power and ground. These internal disturbances can slow circuit performance or even upset circuit operation, e.g., changing the stored state of a data storage circuit. Simply having a radiation hardened process is often not adequate to suppress these type of effects.

It is common practice to characterize the sensitivity of a circuit using four main categories including: (1) total dose; (2) dose rate; (3) Single Event Upset (SEU); and (4) neutron. The present invention is primarily directed toward reducing the sensitivity of a data storage circuit to Single Event Upsets, and can also increase the dose rate hardness of the circuit. The data storage circuit may be a latch, register, a memory cell, or any other type of data storage circuit.

Orbital/interplanetary space is a relatively severe single event upset (SEU) environment. SEU is caused by energetic particles traversing through circuit nodes and depositing sufficient charge to disrupt circuit operation. Heavy particles are considered the dominating cause for data upsets. Heavy particles are capable of depositing relatively large amounts of charge on a circuit node. The particle distribution of concern is typically random, homogeneous in three-dimensional space, with a relatively small flux. Because of this particle distribution, the act of actually striking any particular circuit node is defined as a probability per unit time, which then correlates to a single event upset rate. A single event upset is an introduced error that can be corrected and is therefore generally called a soft error. The rate at which the soft errors accumulate is called the soft error rate (SER) and is equivalent to the single event upset rate. If the circuit of interest has more than one sensitive node, the SER for each node is summed to define the total SER for the circuit.

For a given node within a data storage circuit, there is typically a maximum deposited charge that a driving transistor or transistors (and nodal capacitance) can absorb while still maintaining the data storage circuit in the desired state. If the radiation-induced charge exceeds the maximum charge threshold, a change in the stored data state can result. Typically, each data storage circuit has one or more nodes that are most sensitive to radiation-induced charge. The maximum charge threshold for the most sensitive node or nodes is called the critical charge of the data storage circuit.

A data storage circuit typically includes a regenerative feedback path, e.g. a bi-stable element that is formed from two cross-coupled inverters, such as found in a memory cell. To maintain a desired data state during a radiation event, the n-channel transistor of one of the inverters must maintain a low data state on the output of that inverter, and the p-channel transistor of the other inverter must maintain a high data state on the output of the other inverter. In many data storage circuits, the transistors are of a minimum size to maximize density and minimize power.

To evaluate the SER of a data storage circuit, it is necessary to consider the maximum current carrying capability of the transistors. When a heavy ion traverses a node within the data storage circuit, it may force the node from its original state to the opposite state for some period of time. This is due to the charge that the heavy ion deposits as it passes through the silicon. If this node is held in the opposite state for a period longer than the delay around the data storage circuit feedback loop, the cell may switch states and the data may be lost.

The length of time that a node is held in its opposite state depends on three main factors. These factors include the total charge deposited on the node, the conductance of the data storage circuit transistors connected to the node, and the delay around the feedback loop of the data storage circuit. One way to reduce the chance of having an upset is to increase the conductance of the transistors (and therefore increase the size of the transistors). However, this increases the size of the data storage circuit, which is often undesirable particularly in large RAM-type memories where the data storage circuit (i.e. memory cell) is duplicated many times. Another way to reduce the chance of having an upset is to increase the feedback delay around the data storage circuit. By increasing the feedback delay, the "on" transistor is given more time to remove the deposited charge before the voltage state change can propagate sufficiently around the data storage circuit to establish the regenerative feedback path and result in a data upset.

The feedback delay can be increased by inserting resistors into the data storage circuit in a cross-coupled configuration. A RAM-type data storage circuit having two cross-coupled resistors is shown in FIG. 1. Cross-coupled resistors have proven effective in increasing the critical charge of a data storage circuit. However, because the resistors increase the delay around the data storage circuit feedback loop, the time required to deliberately write the data storage circuit is also increased. For a typical SEU requirement, the resistors must be of a size that increases the write time by as much as 5×relative to the write time of the data storage circuit without the cross-coupled resistors. This can be a significant performance penalty.

Another limitation of using cross-coupled resistors is that the material of choice is often polysilicon, often with a sheet resistance of about 100 k-ohm/square. In this region, the temperature coefficient of the polysilicon material is typically large. The temperature coefficient can cause write times to change radically with temperature. In the past, write time increases were acceptable in view of the increased SEU hardness. However, as system memory sizes increase, lower SER's are necessary, and the resulting write time increases are becoming unacceptable from a system perspective.

In another approach, the feedback delay around the data storage circuit can be increased by inserting cross-coupled transistors, which are then turned on during a write operation. A RAM-type data storage circuit having two cross-coupled transistors is shown in FIG. 2. The source of each cross-coupled transistor is connected to the output of one of the data storage circuit inverters. The drain of each cross-coupled transistor is connected to the input of the other one of the data storage circuit inverters. Finally, the gate of each cross-coupled transistor is connected to a word line.

The operation of the cross-coupled transistor cell is much the same as that of a standard data storage circuit with the following exception. When the word line is high, i.e. the cell is selected, the resistance of the cross-coupled transistor is low because the transistors are "on". Thus, the cell can be written relatively quickly. When the word line is low, the resistance of the cross-coupled transistors is high because the transistors are "off." Thus, the cell may have improved SEU hardness to heavy ion hits.

To function properly, the cross-coupled transistors must typically be sufficiently "leaky" when turned "off" to ensure that the data storage circuit remains in the desired state without requiring refresh. This is often accomplished by introducing a resistive element (see FIGS. 3–4) in parallel with the cross-coupled transistors. The resistive element must be large enough to provide the necessary SEU hardness for the data storage circuit. When the data storage circuit is written, the resistive element is shorted out by the cross-coupled transistor.

When using a bulk-technology, the cross-coupled transistor approach may have a number of limitations. The body terminal of the cross-coupled transistors typically cannot be effectively isolated from the power supply potentials. This increases the SEU sensitive area, i.e., the sensitive cross sectional area of nodes A and A' in FIG. 2. The sensitive area can be defined as any reversed biased junction, such that when a particle passes through the depletion region of the reversed biased junction, the deposited charge drifts and diffuses in a way that attempts to transition the voltage of the node to the opposite state.

In order to improve the SEU immunity, the resistance that is provided in parallel with the cross-coupled transistors must be at least 10–100× higher than the resistance of the inverter output nodes. Because A and A' are high impedance nodes, they will be easily discharged and held at ground (if the cross-coupled transistors are n-channel devices) or VDD (if the cross-coupled transistors are p-channel devices) when a SEU event strikes the body or junction thereof. This state change on the input to the inverter propagates through to its output node such that node A equals A', and the state of the data storage circuit becomes indeterminate.

One way to reduce the sensitive area within the cross-coupled transistors is to effectively isolate the body terminal from the power supply potentials, which is most easily done using an SOI technology. U.S. Pat. No. 5,631,863 to Fechner et al. discloses one such approach, and is generally shown in FIGS. 3–4 of the present specification. In Fechner et al., and referring to FIGS. 3–4, data storage circuit 10 includes an N-channel cross-coupled transistor 40, having source 46 connected to node 16, drain 48 connected to node 19 and gate 44 connected to word line 30. Data storage circuit 10 also includes N-channel cross-coupled transistor 42 having source 41 connected to node 18, drain 43 connected to node 17 and gate 45 connected to word line 30.

The body of the n-channel cross-coupled transistors 40 and 42 must be at the same potential as the source and drain terminals when the word line is turned off, i.e, in the SEU immune mode. This requires that the body be isolated relative to the normal well potentials experienced by the other transistors in the circuit. However, total isolation of the body leaves it floating and this is not desirable, since it can lead to circuit instability.

In order to reduce the instability caused by a floating body, Fechner et al. suggest providing a resistive contact $R_S$ between the body and the source, and a resistive contact $R_D$ between body and the drain. Using N-channel transistor 40 as an example, FIG. 4 shows resistive contact $R_S$ between the body 50 and the source 46, and the resistive contact $R_D$ between body 50 and the drain 48. FIG. 4 also shows top gate 44 of N-channel transistor 40, and the grounded parasitic backside gate 47 which results from the buried oxide layer of the illustrative SOI process. When transistor 40 is off, resistive contacts $R_S$ and $R_D$ provide a relatively large resistance path which sets S=B=D, leaving no reverse bias junctions and therefore no sensitive volumes. When transistor 40 is on, resistive contacts $R_S$ and $R_D$ are shorted out, allowing a relatively fast write time.

A limitation of Fechner et al. is that the resistance values of the resistive contacts $R_S$ and $R_D$ can be fairly limited. For example, Fechner et al. state that the resistance values should be sufficiently low to prevent parasitic drain-to-source bipolar gain effects, and sufficiently high to provide a desired level of SEU protection. These restrictions may ultimately limit the SEU protection that can be achieved. Another limitation of Fechner et al. is that the write times may be longer than optimal because the cross-coupled transistors 40 and 42 do not provide full rail drive during a write operation. While an increase in the write time can be seen in most data storage circuits with this SEU hardening approach, the most pronounced increase is often seen in data storage circuits that have only one side of the cross-coupled inverter pair driven during a write operation, such as a latch. In a memory cell, for example, both sides of the cross-coupled inverters are driven and the write time increase is less pronounced.

SUMMARY OF THE INVENTION

The present invention overcomes many of the disadvantages of the prior art by providing a SEU hardening circuit that can provide full rail drive during a write operation. The present invention also provides a SEU hardening circuit that is not susceptible to parasitic bipolar gain effects, potentially increasing the SEU protection that can be achieved.

To provide full rail drive during a write operation, the present invention contemplates providing a SEU hardening circuit that has a transmission gate, rather than simply a n- or p-channel transistor. The transmission gate includes both a p-channel transistor and an n-channel transistor, with the source and drain of the p-channel transistor and the n-channel transistor connected together. The p-channel transistor provides full rail drive in a positive voltage direction, and the n-channel transistor provides full rail drive in the negative voltage direction. As indicated above, full rail drive decreases the write time of most data storage circuits, especially those circuits that only have one data input.

In one illustrative embodiment, a resistive element is connected between the source and drain of the n-channel and p-channel transistors. The resistive element provides a conducting path in parallel with the n-channel and p-channel transistors when the n-channel and p-channel transistors are turned "off". This conducting path allows the data storage circuit to hold a data state without requiring refresh. The resistive element preferably has a sufficiently high value to provide a desired level of SEU protection. During a write operation, both the n-channel and p-channel transistors are turned "on", and the resistive element is effectively shorted out. This minimizes the write time of the data storage circuit. In addition, and because both a n-channel and a p-channel transistors are included, full rail drive is achieved in both voltage direction. This even further improves the write time.

The substrate of the n-channel transistor and the p-channel transistor may be left floating, or may be connected to an appropriate power supply. If left floating, parasitic bipolar action may occur. That is, the substrate may drift above a $V_{be}$ threshold above either the source or drain. This can cause a parasitic bipolar transistor to turn on. If the substrate is connected to a power supply, the substrate to source or drain junctions may be reversed biased creating a depletion region. The depletion region increases the sensitive volume of the data storage circuit, making the data storage circuit more susceptible to SEU upsets. While neither of these cases is ideal, they do harden the nodes not associated with the hardening circuit and therefore provide some increased SEU immunity.

It is contemplated that the substrate may be connected to an intermediate voltage. To provide the intermediate voltage, the resistive element may include a voltage divider that has a tap terminal. The tap terminal may provide the intermediate voltage to the substrate terminals of both the n-channel and p-channel transistors. Alternatively, the resistive element may include both a first voltage divider and a second voltage divider. The first voltage divider may provide an intermediate voltage to the substrate terminal of the p-channel transistor, and the second voltage divider may provide an intermediate voltage to the substrate terminal of the n-channel transistor. The resistor elements may include one or more resistors formed from polysilicon, doped silicon, or any other resistive material, element or elements. The resistors may also be constructed in accordance with co-pending U.S. patent application Ser. No. 09/219,804, filed Dec. 23, 1998, and entitled "Integrated Circuit Impedance Device And Method Of Manufacture Therefor", which is incorporated herein by reference.

In accordance with another illustrative embodiment of the present invention, two or more resistors are placed in series, with an n-channel transistor connected in parallel with one of the resistors and a p-channel transistor connected in parallel with another one of the resistors. This configuration may provide a SEU hardening circuit that is not susceptible to bipolar gain effects. As indicated above, bipolar gain effects can reduce the effectiveness of a SEU hardening circuit.

In an illustrative embodiment, the source of the n-channel transistor is connected to an output of one of the cross-coupled inverters of the data storage circuit, and the source of the p-channel transistor is connected to the input of another one of the cross-coupled inverters of the data storage circuit. Further, the drain of the n-channel transistor is connected to the drain of the p-channel transistor. Then, a first resistor is provided between the source and drain of the n-channel transistor and a second resistor is provided between the source and drain of the p-channel transistor.

To prevent bipolar action in the n-channel transistor, the body and source of the n-channel transistor are connected together. Likewise, the body and drain of a p-channel transistor are connected together. In this configuration, the n-channel transistor has a parasitic diode between its body and drain. Likewise, the p-channel transistor has a parasitic diode between its source and body. However, because the parasitic diodes are not aligned with one another, current cannot directly flow through the n-channel and p-channel transistors via the parasitic diodes. Rather, any current must flow through at least one of the resistor elements. A number of other variations of this basic embodiment are also contemplated, as more fully described below.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
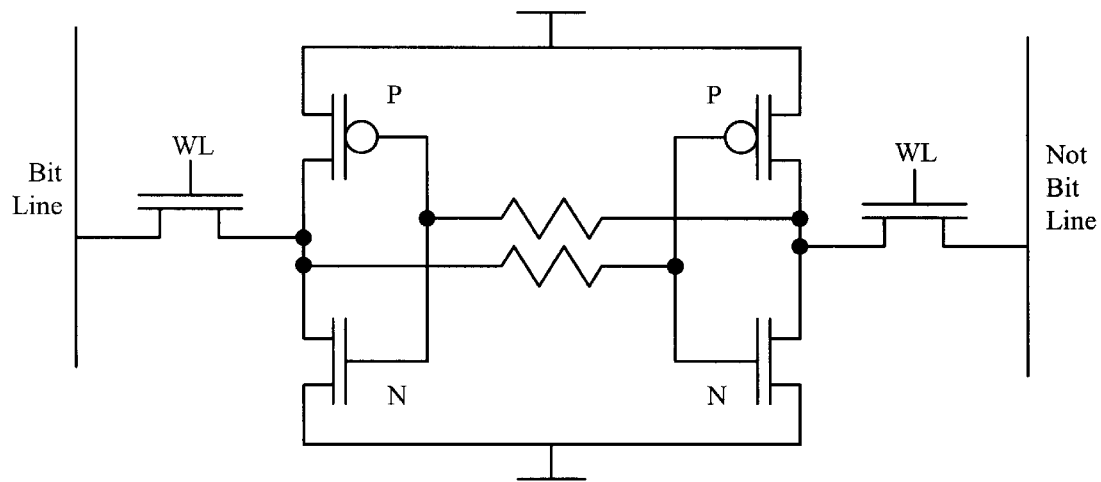
FIG. 1 is a schematic diagram of a data storage circuit using cross-coupled resistors as found in the prior art.
Figure 2:
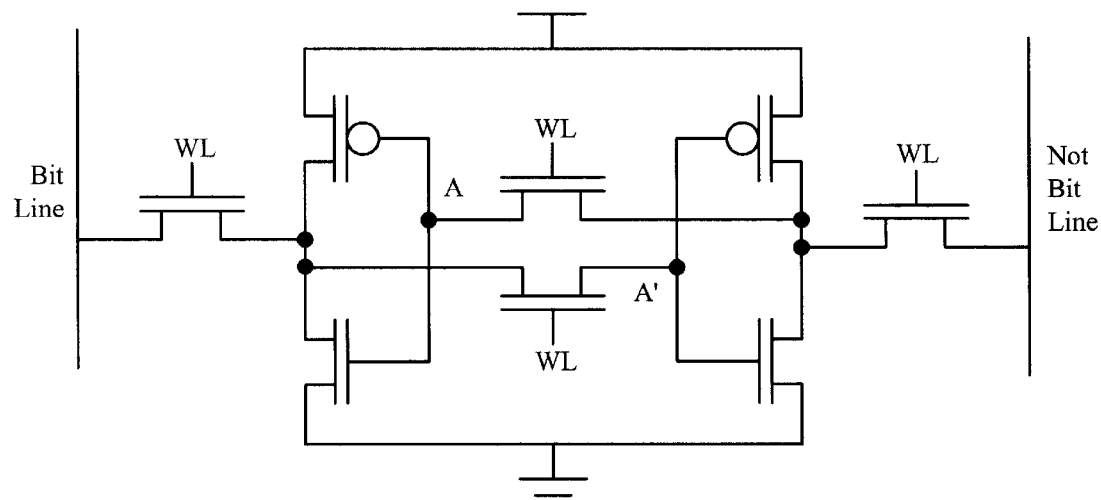
FIG. 2 is a schematic diagram of a data storage circuit using cross-coupled transistors as found in the prior art.
Figure 3:
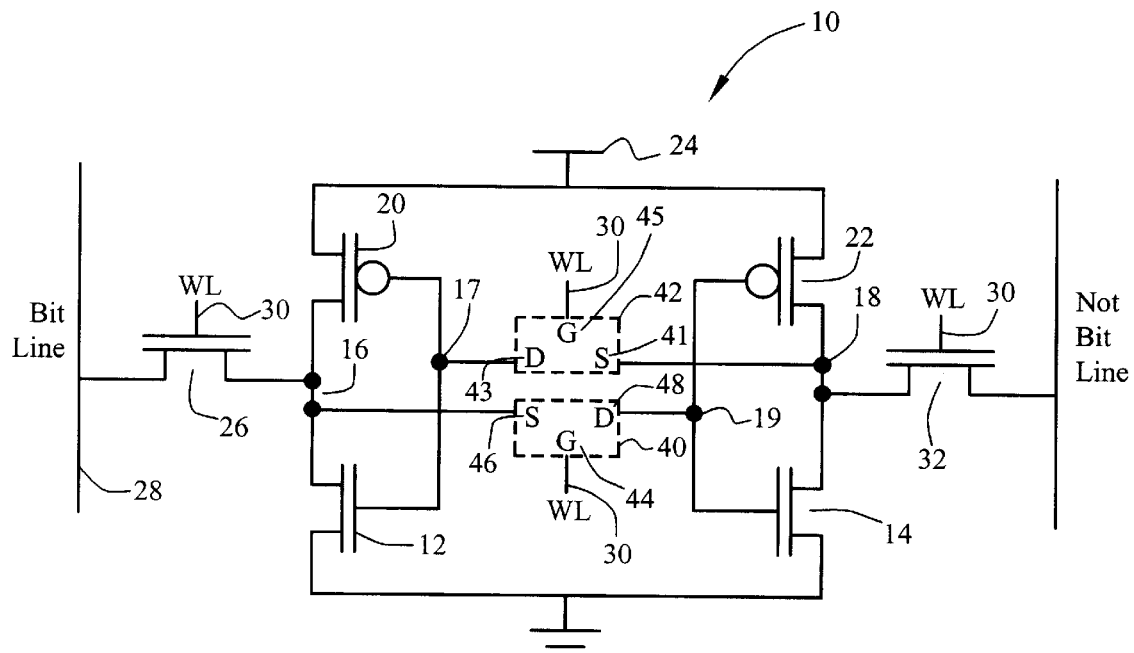
FIG. 3 is a schematic diagram of a data storage circuit using cross-coupled transistor coupling elements, as found in the prior art.
Figure 4:
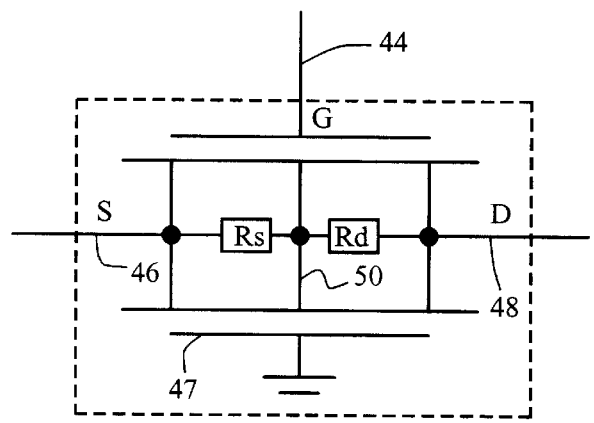
FIG. 4 is a schematic diagram detailing one of the transistor coupling elements of FIG. 3.
Figure 5:
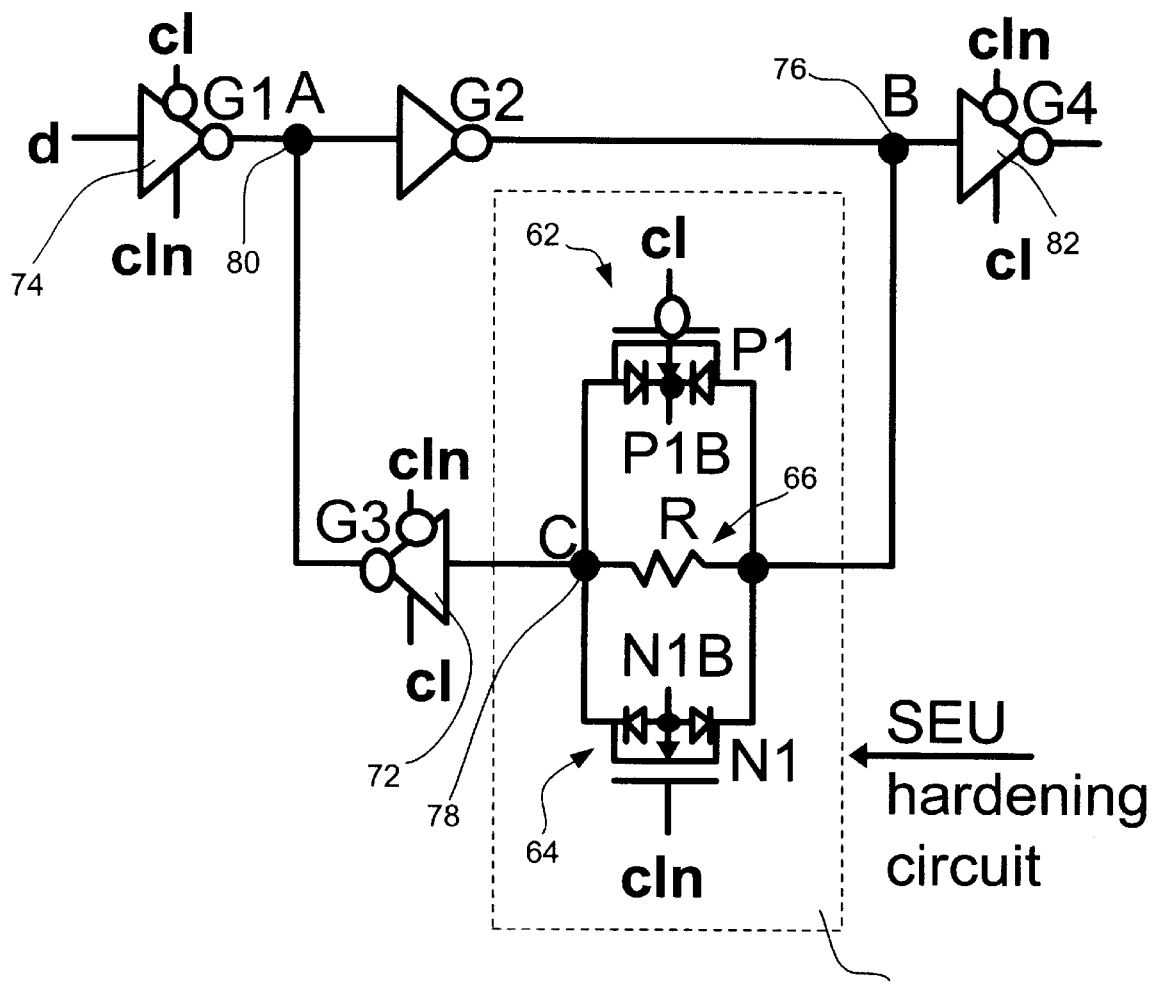
FIG. 5 is a schematic diagram of a data storage circuit incorporating an illustrative SEU hardening circuit of the present invention.

As indicated above, the present invention provides a SEU hardening circuit that provides full rail drive during a write operation and/or is not susceptible to parasitic bipolar gain effects. To provide full rail drive during a write operation, the SEU hardening circuit includes a transmission gate, rather than just an n- or p-channel transistor. One such SEU hardening circuit is shown in FIG. 5. The transmission gate includes a p-channel transistor P1 62 and an n-channel transistor N1 64, with the source and drain of the p-channel transistor P1 62 and the n-channel transistor N1 64 connected together. The p-channel transistor P1 62 provides full rail drive in a positive voltage direction, and the n-channel transistor N1 64 provides full rail drive in the negative voltage direction. As indicated above, full rail drive may decrease the write time of some data storage circuit, particularly those that have only one data input.

The circuit shown in FIG. 5 is the master stage of a flip-flop. However, it is recognized that the present invention may be used with any type of data storage element including a memory cell, latch, register, etc, and more than one SEU hardening circuit may be placed in the feedback loop. As indicated above, the SEU hardening circuit 60 includes p-channel transistor P1 62, n-channel transistor N1 64 and hardening resistor R 66. The substrate connection and the parasitic PN junctions between the drain/substrate and the source/substrate for transistors P1 62 and N1 64 are also shown to assist in the following discussion.

The data storage element includes cross-coupled inverters G2 70 and G3 72. Inverter G3 72 is shown having complementary enable signals cl and cln, which are enabled when a particular data state is to be stored. To perform a write operation, Inverter G3 72 is disabled and inverter G1 74 is enabled. Although the SEU hardening circuit 60 is positioned between node B 76 and node C 78, it is contemplated that it could also be placed between node A and the input to Inverter G2 70, or in both places.

The purpose of hardening resistor 66 of the SEU hardening circuit 60 is to provide an increased RC delay between the sensitive volumes (drains) of one inverter stage of the data storage element and the input to the next stage. When a particle strikes the sensitive volumes on node A 80 or node B 76, the hardening resistor 66 may significantly delay the voltage state change on node C 78, allowing Inverter G3 72 or Inverter G2 70 more time to remove the deposited charge on node A 80 or node B 76, respectively, and restore the original stored data state. The larger the resistor (or the larger the total RC delay in the feedback loop due to multiple placements of the SEU hardening circuit), the more deposited charge the circuit can tolerate without experiencing an upset.

The purpose of the n- and p-channel transistors 62 and 64 is to short out the hardening resistor 66 during a write operation. By providing both p-channel transistor P1 62 and n-channel transistor N1 64, full rail drive may be provided in both voltage directions, thereby potentially decreasing the write time of the data storage element.

It is contemplated that the substrates of p-channel transistor P1 62 and the n-channel transistor N1 64 may be connected to VDD and VSS, respectively. While this bias configuration may provide a reduced SER for the data storage element, it may result in a net increase in sensitive volume. That is, when node C 78 is in a high state, the PN junction between node C 78 and the substrate (N1B) of n-channel transistor N1 64 is reverse biased. The resulting depletion region creates a sensitive volume on node C 78. When this sensitive volume is struck by a particle, node C 78 may discharge to a low state.

Likewise, when node C is in a low state, the PN junction between node C 78 and the substrate (P1B) of p-channel transistor P1 62 is reverse biased. The resulting depletion region may also create a sensitive volume on node C 78. When this sensitive volume struck by a particle, node C 78 may be charge to a high state. In either case, the effectiveness of the hardening resistor 66 may be reduced, since a data state change on node C 78 may quickly pass to node A 80, which may quickly pass on to node B 76 to re-enforce the data state change on node C 78.

While connecting the P1/N1 substrates to VDD/VSS may not be an ideal option for SEU hardening, it does provide some level of SEU protection against particle strikes on the sensitive volumes of node B 76 and node A 78 associated with Inverter G3 72 and Inverter G2 70, respectively. Thus this embodiment may reduce the net SER of the data storage cell.

It is contemplated that the substrates of p-channel transistor 62 and n-channel transistor 64 may also be left floating. This is relatively easy to do in SOI, but is more difficult to accomplish in a Bulk technology. While this bias configuration may reduce the overall SER of the data storage element, it may result in a sensitive volume on node C. In addition, it may result in the activation of a parasitic bipolar junction transistor of the p-channel transistor P1 62 or the n-channel transistor N1 64 when the voltage on node B 76 transitions due to either a particle strike on node B 76 or node A 80.

Consider the case where node C 78 and node B 76 are high. If the p-channel transistor P1 62 and the n-channel transistor N1 64 diodes are ideal (that is, Isat=0), the n-channel substrate N1B is at VSS+Vdfwr (Vdfwr is the diode forward bias voltage of about 0.7 V), and the p-channel substrate P1B is at VDD−Vdfwr. The n-channel substrate N1B is at VSS+Vdfwr because when node B 76 and node C 78 previously transitioned from a high (VDD) to a low (VSS), the n-channel substrate N1B to node B 76 diode of n-channel transistor N1 becomes forward biased, bringing the n-channel substrate N1B to a maximum voltage of VSS+Vdfwr. Note, when n-channel transistor N1 64 turns off (cln goes low), there is a gate (cln) to substrate (N1B) coupling capacitance that will drive the n-channel substrate N1B to less than VSS+Vdfwr, where the amount is dependent on the capacitance ratio between cln and the n-channel substrate N1B and the total capacitance on the n-channel substrate N1B. However, this negative voltage shift is reversed when cln goes high for the next data state change, where node B 76 and node C 78 go from a low to a high. The PN junctions between node B 76 and n-channel substrate N1B and node C 78 to n-channel substrate N1B remain reverse biased but there is coupling capacitance which tends to drive the voltage of the n-channel substrate N1B>VSS+Vdfwr. However, when cln goes low again, this tends to drive the voltage of the n-channel substrate N1B negative again due to the gate coupling capacitance. The gate to substrate coupling capacitance is in general greater than the source/drain to substrate coupling capacitance. Therefore, in general, the voltage of the n-channel substrate NiB will remain around VSS+Vdfwr. Likewise, but with complement voltages, the p-channel substrate P1B will behave in a similar manner.

With node B 76 and node C 78 high, and the n-channel substrate N1B at VSS+Vdfwr, the PN junction between node C and the n-channel substrate N1B is reverse biased. The resulting depletion region in n-channel transistor 64 can create a sensitive volume on node C 78. A particle strike in this region may discharge node C and charge up the n-channel substrate N1B, particularly since the n-channel transistor substrate N1B is not actively driven low. The final voltage values will depend on the relative capacitance between the node C 78 and the n-channel substrate N1B. If the n-channel substrate capacitance is on the same order as the capacitance of node C 78, the voltage on node C could discharge to about VDD/2 or less. If the voltage switch point of Inverter G3 72 is greater than VDD/2, a high may be passed on to node A 80, and then a low on node B 76 and further reduce the voltage state on node C 78, thereby reinforcing a high to low SEU strike. The same thing occurs with p-channel transistor P1 62 with complement voltages.

If the substrate capacitance's of p-channel transistor 62 and n-channel transistor 64 are much less than the capacitance of node C 78, a particle strike on the sensitive volume on node C 78 may not transition the voltage past the switch point of Inverter G3 72, and no SEU would occur.

Since the p-channel transistor P1 62 and the n-channel transistor N1 64 diodes are not ideal (that is, Isat is greater than 0), when node B 76 and node C 78 are high long enough, the n-channel substrate N1B and the p-channel substrate P1B will also be high. Thus, when a particle strike on either node B 76 or node A 80 causes node B 76 to go low, the PN junction between the n-channel substrate N1B and node B 76 will forward bias and potentially cause the parasitic BJT (Bipolar Junction Transistor) associated with n-channel transistor N1 64 to turn on and short out the hardening resistor 66. This could then cause node C 78 to go to a low state and cause a data upset.

The source of the base current may be from the capacitance of the n-channel substrate N1B. The amount of bipolar current from node C 78 to node B 76 is dependent on the amount of base current, and the gain of the parasitic BJT. The same thing may occur with p-channel transistor P1 62, with complement voltages.

If there is a high enough hole-electron recombination in the substrate regions of the p-channel transistor P1 62 and the n-channel transistor N1 64 and/or there is insufficient base current available due to the small amount of substrate capacitance, then the BJT action may not be significant enough to short out the hardening resistor 66 when there is a voltage transition on node B 76.

Figure 6:
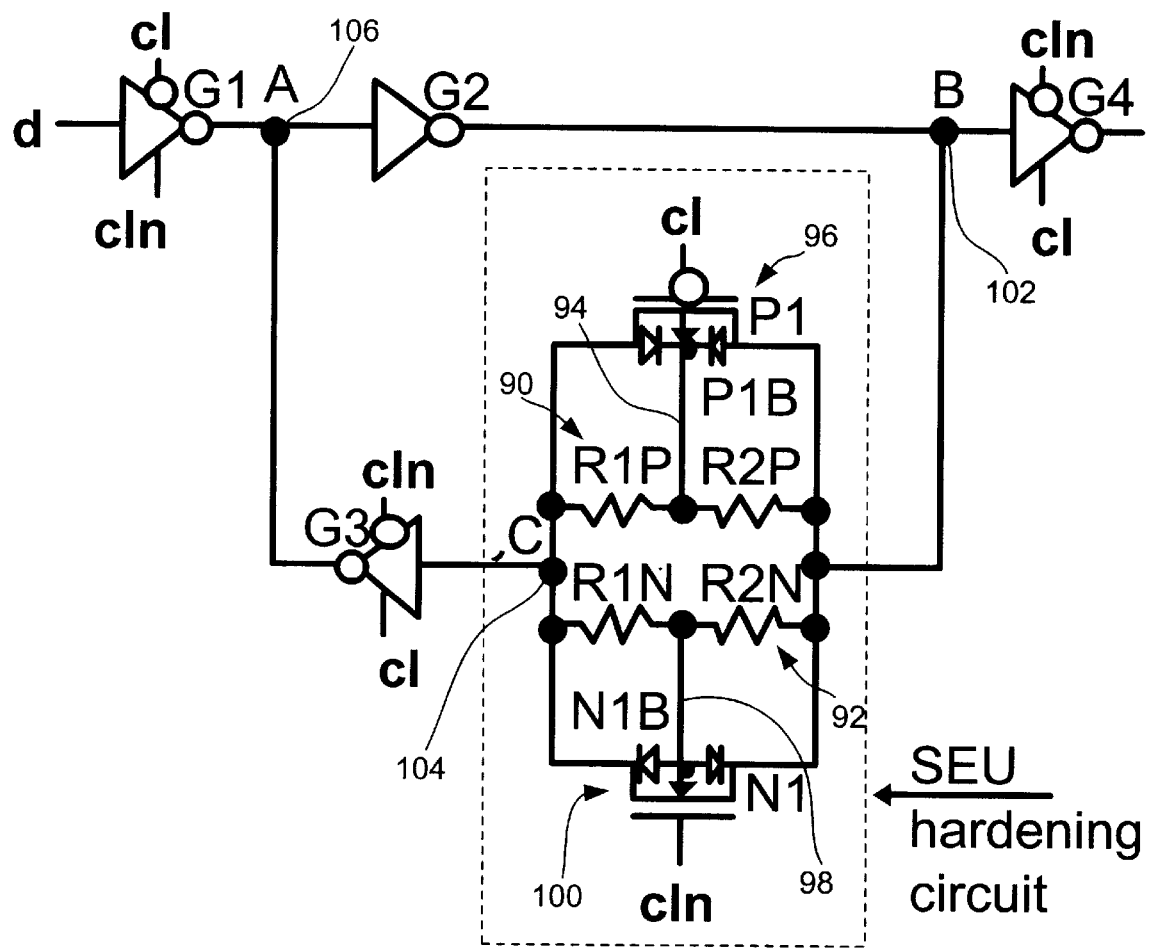
FIG. 6 is a schematic diagram of a data storage circuit incorporating another illustrative SEU hardening circuit of the present invention.

It is contemplated that the substrate of the p-channel transistor P1 62 and the n-channel transistor N1 64 may be connected to one or more intermediate voltages. FIG. 6 is a schematic diagram of one such SEU hardening circuit. To provide an intermediate voltage, the resistive element includes both a first voltage divider 90 and a second voltage divider 92. The first voltage divider 90 has a tap terminal 94 for providing an intermediate voltage to the substrate P1B of the p-channel transistor P1 96. Likewise, the second voltage divider 92 has a tap terminal 98 for providing an intermediate voltage to the substrate N1B of the n-channel transistor N1 100. Each voltage divider includes two or more resistive elements. Each resistive element may be formed from polysilicon, doped silicon, or any other resistive material, element or elements. The resistors may also be constructed in accordance with co-pending U.S. patent application Ser. No. 09/219,804, filed Dec. 23, 1998, and entitled "Integrated Circuit Impedance Device And Method Of Manufacture Therefor", which is incorporated herein by reference.

Preferably, the SEU Hardening circuit of FIG. 6 is fabricated using a SOI process instead of bulk technology to eliminate the nwell (pwell) junction associated with the substrates of the p-channel transistor P1 96 and the n-channel transistor (N1) 100. When p-channel transistor P1 96 and n-channel transistor N1 100 are off, a resistance path is provided between node B 102 and node C 104 without generating any sensitive volumes. Further, when P1 and N1 are on, full rail drive (i.e., node B drives node C to VDD or VSS) is provided.

If p-channel transistor P1 96 and n-channel transistor N1 100 are off, and node B 102 and node C 104 are high, the voltage dividers 90 and 92 ensure that the p-channel substrate P1B and the n-channel substrate N1B are also high. There are no reverse biased junctions and no voltage gradients in the silicon associated with p-channel transistor P1 96 and n-channel transistor N1 100. The same holds true if node B 102 and node C 104 are low. Therefore, there are no sensitive volumes associated with p-channel transistor P1 96 and n-channel transistor N1 100.

If a particle strikes the sensitive volume on node B 102 or node A 106, causing node B 102 to transition from a high to a low, current will flow through the voltage divider 92, for example, until the substrate N1B of the n-channel transistor is about one Vdfwr above the voltage of node B 102. At this time, the diode between the substrate N1B of the n-channel transistor 100 and node B becomes forward biased, which can turn on the parasitic BJT of the n-channel transistor 100. The parasitic BJT of the p-channel transistor P1 96 operates in a similar manner.

The amount of current that flows through the parasitic BJTs of the p-channel transistor P1 96 and/or the n-channel transistor N1 100 is dependent on the amount of base current that can be supplied to the substrates. If the substrate capacitance of the p-channel transistor 96 and the n-channel transistor 100 are small compared to the total capacitance on node C, the base current is primarily supplied by the voltage divider circuits 90 and 92. Thus, the parasitic BJT base current is limited to $I_b$=(node C voltage—node B voltage)/ (Effective Resistance of the Voltage Divider Circuits 90 and 92). Therefore, it is contemplated that the parasitic BJT action can be managed by selecting appropriate resistor values for the voltage divider circuits 90 and 92.

Figure 7:
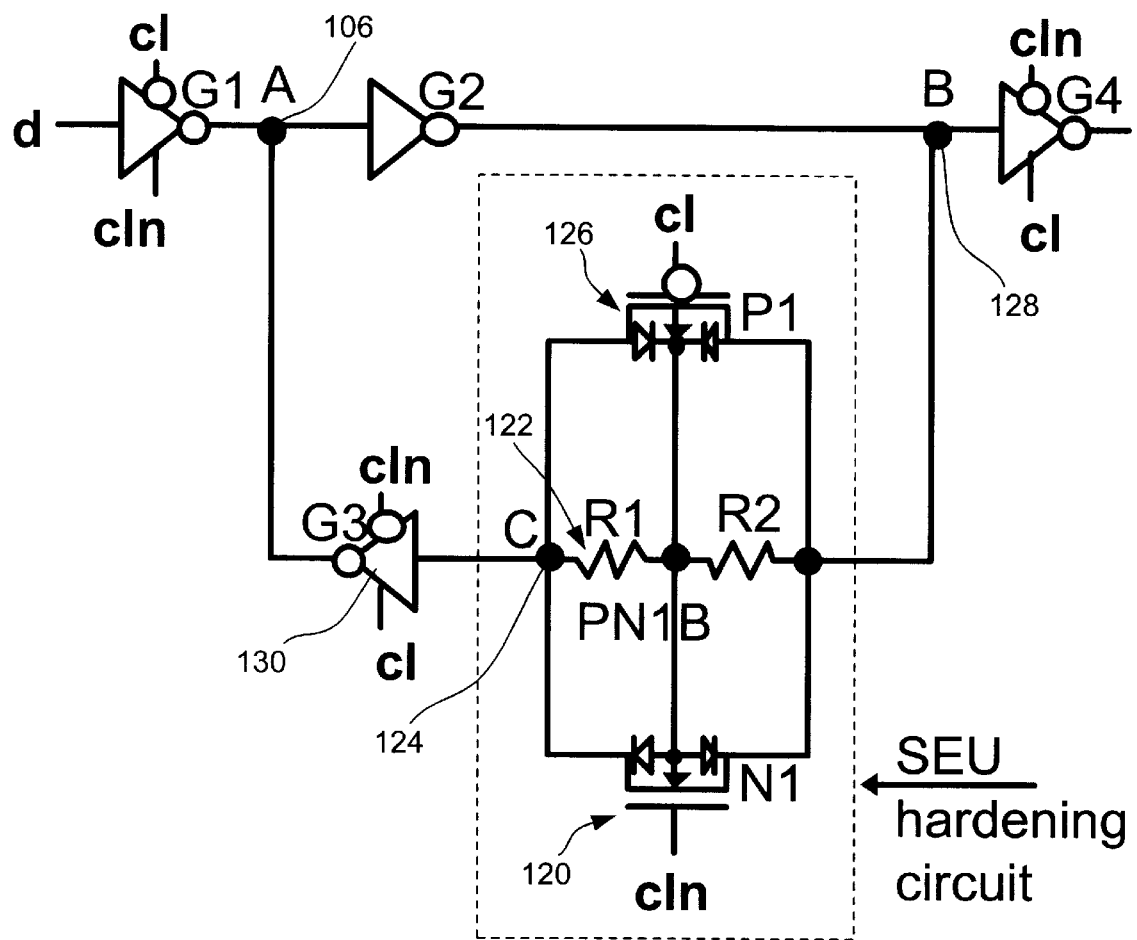
FIG. 7 is a schematic diagram of a data storage circuit incorporating yet another illustrative SEU hardening circuit of the present invention.

In another illustrative embodiment, the first and second voltage dividers 90 and 92 may be combined by connecting the p-channel substrate P1B to the n-channel substrate N1B, as shown in FIG. 7. The circuit shown in FIG. 7 behaves similar to the circuit of FIG. 6 until the p- and n-channel substrates PN1B each reach a voltage that equals about one Vdfwr. This occurs when the voltage between node C 104 and node B 102 is equal to about 2* Vdfwr.

Once this occurs, the parasitic BJT base current for n-channel transistor N1 120 is supplied by both R1 122 and the PN diode between node C 124 and the substrate of the p-channel transistor P1 126. Therefore, the base current is no longer solely controlled by the resistor network. This can result in larger base currents, which may produce a larger parasitic BJT current between node C 124 and node B 128 relative to the circuit shown in FIG. 6. However, it is recognized that as VDD decreases, the hardness of the circuit shown in FIG. 7 increases. This is because the voltage 2×Vdfwr becomes a larger percentage of the VDD to VSS voltage span, making it more difficult for the n-channel transistor N1 120 and the p-channel transistor P1 126 diodes to pull node C 104 past the switch point of Inverter G3 130.

Figure 8:
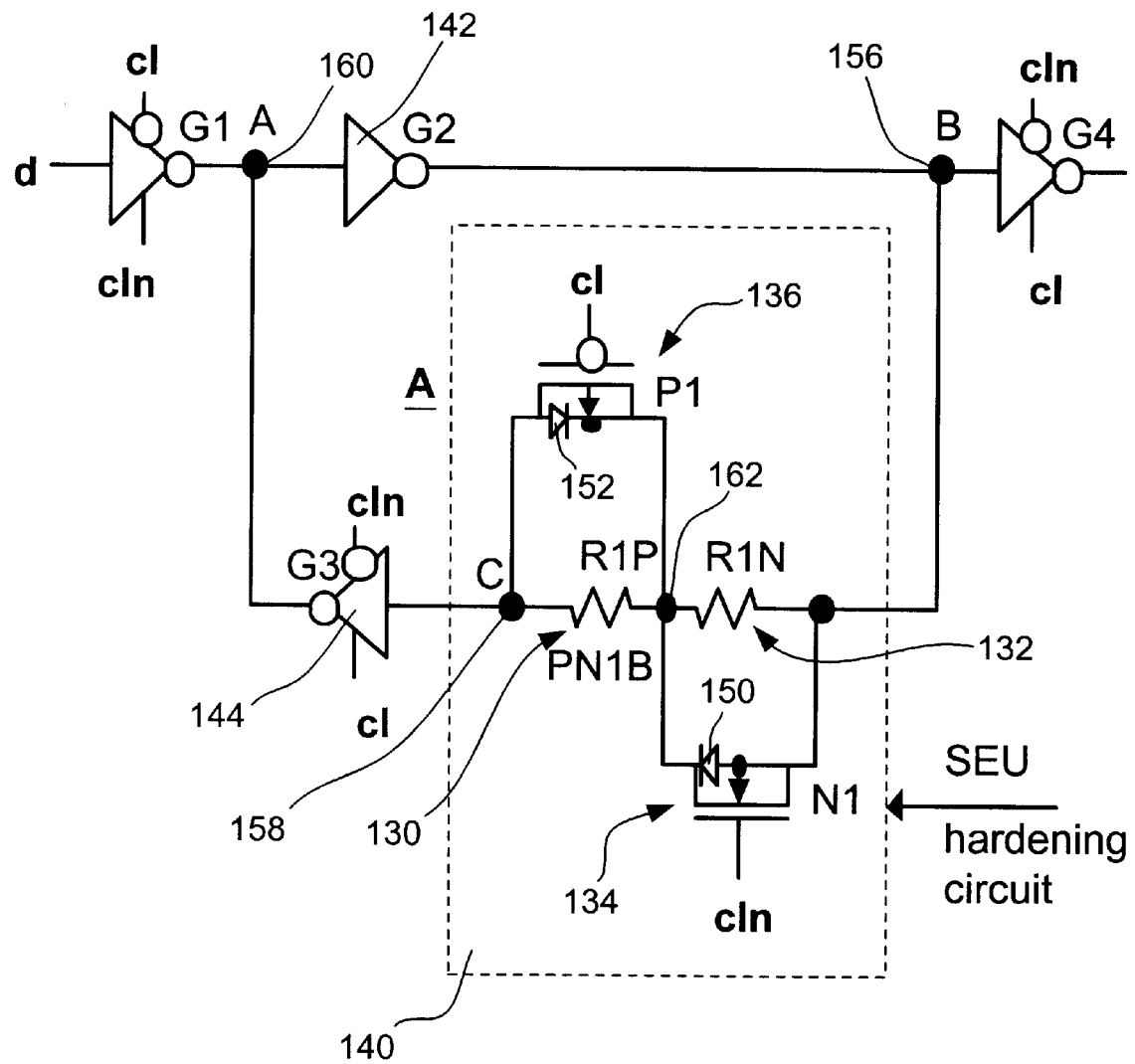
FIG. 8 is a schematic diagram of an illustrative embodiment of the present invention for reducing or eliminating any parasitic bipolar action in the transistors of the SEU hardening circuit.
Figure 9:
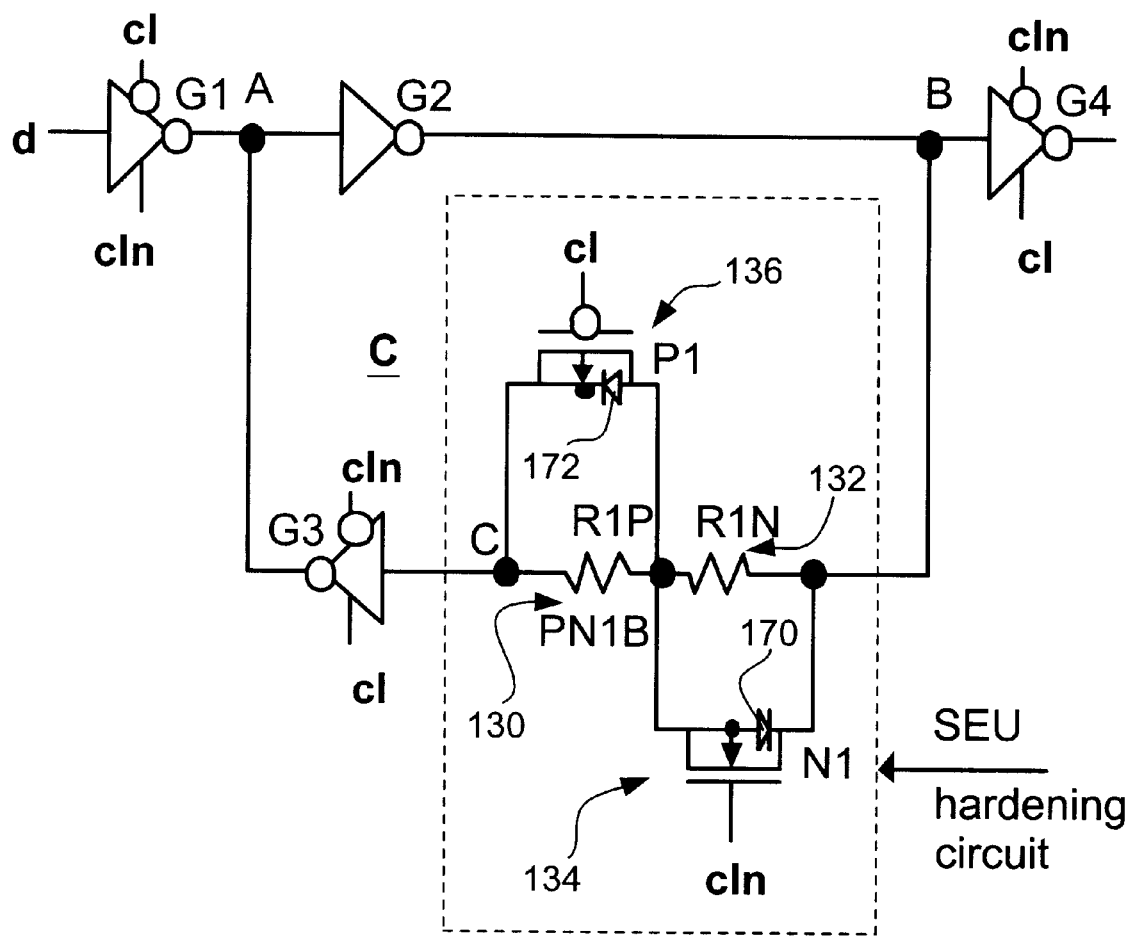
FIGS. 9–11 are schematic diagrams showing three more variations of the embodiment of FIG. 8.
Figure 10:
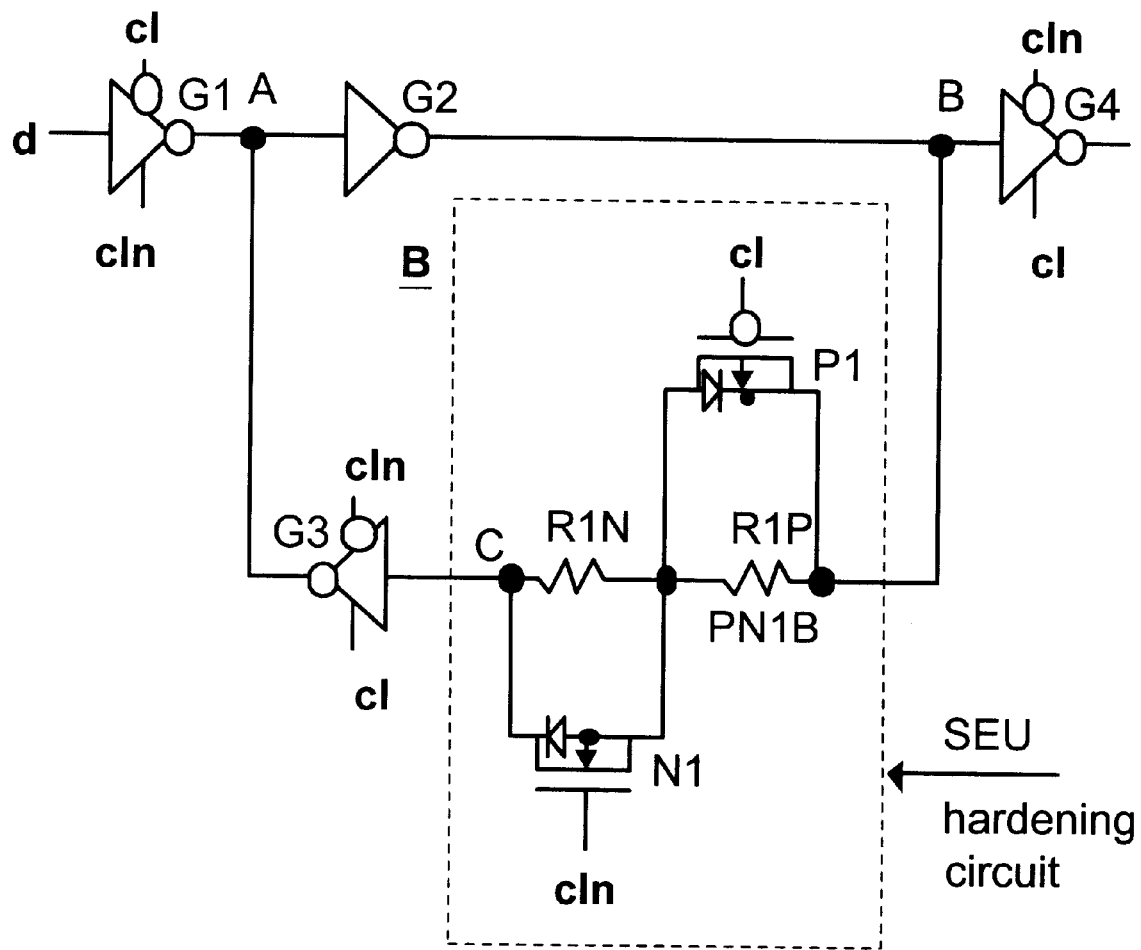
Figure 11:
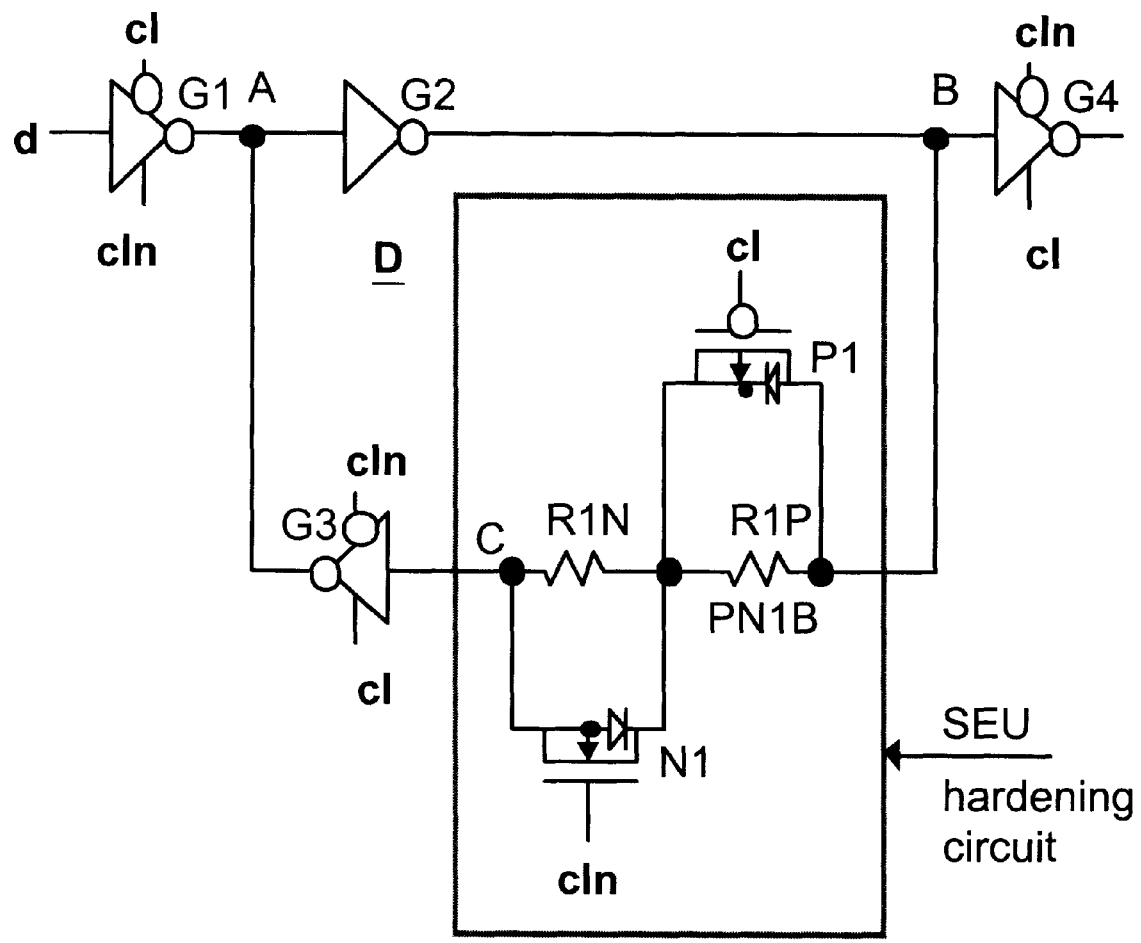

FIG. 8 is a schematic diagram of an illustrative embodiment of the present invention for reducing or eliminating parasitic bipolar action in the transistors of the SEU hardening circuit. FIGS. 9–11 are schematic diagrams showing three more variations of the embodiment of FIG. 8. Referring specifically to FIG. 8, two or more resistors 130 and 132 are placed in series, with an n-channel transistor N1 134 connected in parallel with resistor 132 and a p-channel transistor P1 136 connected in parallel with resistor 130. Also, the source of the n-channel transistor N1 134 is connected to an output of Inverter G2 142, and the source of the p-channel transistor P1 136 is connected to the input of Inverter G2 144. Finally, the drain of the n-channel transistor N1 134 is connected to the drain of the p-channel transistor P 136.

To prevent bipolar action in the n-channel transistor N1 134, the body and source of the n-channel transistor N1 134 are tied together as shown. Likewise, to prevent bipolar action in the p-channel transistor P1 136, the body and drain of a p-channel transistor P1 136 are tied together, as shown. In this configuration, the n-channel transistor N1 134 has a parasitic diode 150 between its body and drain. Likewise, the p-channel transistor P1 136 has a parasitic diode 152 between its source and body. However, because the parasitic diodes 150 and 152 are not aligned with one another, current cannot directly flow through the n-channel transistor N1 134 and the p-channel transistor P1 136 via the parasitic diodes 150 and 152. Rather, the current must flow through at least one of the resistor elements 130 and 132. A number of other variations of this basic embodiment are also contemplated, as more fully described below.

If the p-channel transistor P1 136 and the n-channel transistor N1 134 are off, and node B 156 and node C 158 are high, the substrates of p-channel transistor P1 136 and n-channel transistor N1 134 are also high. There are no reverse biased junctions and no voltage gradients in the silicon associated with p-channel transistor P1 136 and n-channel transistor N1 134. The same holds true if nodes B and C are low. Therefore there are no sensitive volumes associated with p-channel transistor P1 136 and n-channel transistor N1 134.

Since the substrate of n-channel transistor N1 134 is tied directly to node B 156, if a particle strikes the sensitive volumes on node B 156 or node A 160, causing node B 156 to transition from a high to a low, the substrate of n-channel transistor N1 134 will immediately be discharged ensuring that no BJT turn-on can occur. The current is thus forced through R1N 132. As node PN1B 162 discharges through R1N 132, diode 152 of p-channel transistor P1 136 is forward biased and shorts out R1P 130. The net result is an RC delay that remains intact between node B 156 and node C 158 via resistor R1N 132. A similar scenario occurs for a low to high transition on node B 156, except the resistor and diode pairings switch roles. Therefore, the effective resistance is the singular values of R1N 132 or R1P 130.

FIGS. 9–11 are similar to the embodiment shown in FIG. 8. For example, the SEU hardening circuit of FIG. 9 has the body and drain of the n-channel transistor N1 134 are tied together, and the body and source of the p-channel transistor P1 136 are tied together. In this configuration, the n-channel transistor N1 134 has a parasitic diode 170 between its body and source. Likewise, the p-channel transistor P1 136 has a parasitic diode 172 between its drain and body. Note that the parasitic diodes 170 and 172 are not aligned with one another, thereby forcing the current to flow through one of the resistors 130 or 132. The SEU hardening circuit of FIGS. 10–11 are similar to those of FIGS. 8–9, but with the positions of the n-channel and p-channel transistors reversed.

It is recognized that since the p-channel transistor P1 136 and n-channel transistor N1 134 are in series, rather than in parallel, full rail drive from node B 156 to node C 158 may not be provided. Thus, the write times associated with the SEU hardening circuits of FIGS. 8–11 may be longer than for the circuits shown and described with reference to FIGS. 5–7.

Having thus described the preferred embodiments of the present invention, those of skill in the art will readily appreciate that the teachings found herein may be applied to yet other embodiments within the scope of the claims hereto attached.

What is claimed is:

1. A SEU hardening circuit for use with a storage cell, wherein the storage cell includes a pair of cross-coupled inverters, the SEU hardening circuit having a first terminal and a second terminal, the first terminal connected to an output of one of the cross-coupled inverters, and the second terminal connected to an input of the other one of the cross-coupled inverters, the SEU hardening circuit comprising:

a resistive means having a first terminal and a second terminal, the first terminal of the resistive means connected to the first terminal of the SEU hardening circuit;

a p-channel transistor with a source terminal, a drain terminal, and a gate terminal;

a n-channel transistor with a source terminal, a drain terminal, and a gate terminal;

the source terminals of the p-channel transistor and the n-channel transistor being electrically connected to the first terminal of the resistive means;

the drain terminals of the p-channel transistor and the n-channel transistor being electrically connected to the second terminal of the resistive means; and the gate terminals of the p-channel transistor and the n-channel transistor being connected to complementary enable signals.

2. A SEU hardening circuit according to claim 1, wherein the p-channel transistor and the n-channel transistor each have a substrate terminal.

3. A SEU hardening circuit according to claim 2, wherein the substrate terminals of the p-channel transistor and the n-channel transistor are left floating.

4. A SEU hardening circuit according to claim 2, wherein the substrate terminal of the p-channel transistor is connected to a first voltage and the substrate terminal of the n-channel transistor is connected to a second voltage.

5. A SEU hardening circuit according to claim 2, wherein the resistive means comprises:

a first voltage divider having a first terminal and a second terminal connected to the first terminal and the second terminal of the SEU hardening circuit, respectively, the first voltage divider also having a tap terminal for providing an intermediate voltage to the substrate terminal of the p-channel transistor;

a second voltage divider having a first terminal and a second terminal connected to the first terminal and the second terminal of the SEU hardening circuit, respectively, the second voltage divider also having a tap terminal for providing an intermediate voltage to the substrate terminal of the n-channel transistor.

6. A SEU hardening circuit according to claim 2, wherein the resistive means comprises:

a first voltage divider having a first terminal and a second terminal connected to the first terminal and the second terminal of the SEU hardening circuit, respectively, the first voltage divider also having a tap terminal for providing an intermediate voltage to the substrate terminals of the p-channel and n-channel transistors.

7. A SEU hardening circuit according to claim 1, wherein the gate terminals of the n-channel transistor and the p-channel transistor being driven high and low, respectively, via the complementary enable signals when the pair of cross-coupled inverters are to be written.

8. A SEU hardening circuit according to claim 1, wherein the p-channel and n-channel transistors are formed using an SOI process.

9. A SEU hardening circuit according to claim 1, wherein the resistive means comprises a polysilicon resistor.

10. A SEU hardening circuit according to claim 1, wherein the resistive means comprises doped silicon.

11. A SEU hardening circuit according to claim 10, wherein the resistive means comprises a body region of a transistor.

12. A SEU hardening circuit for use with a storage cell, wherein the storage cell includes a pair of cross-coupled inverters, the SEU hardening circuit having a first terminal and a second terminal, the second terminal connected to an input of one of the cross-coupled inverters, and the first terminal connected to an output of the other one of the cross-coupled inverters, the SEU hardening circuit comprising:

first resistor means having a first terminal and a second terminal;

a p-channel transistor having a source, a drain, a gate and a substrate terminal;

the source terminal and the drain terminal of the p-channel transistor being coupled to the first terminal and second terminal of the first resistor means; the substrate terminal of the p-channel transistor being coupled to one of the source or drain terminals of the p-channel transistor, leaving a parasitic diode from the other of the source or drain terminals to the substrate terminal of the p-channel transistor; the parasitic diode allowing a current to pass in a first direction relative to the source/drain terminals of the p-channel transistor when forward biased;

second resistor means having a first terminal and a second terminal;

a n-channel transistor having a source, a drain, a gate and a substrate terminal; the source terminal and the drain terminal of the n-channel transistor being coupled to the first terminal and second terminal of the second resistor means; the substrate terminal of the n-channel transistor being coupled to one of the source or drain terminals of the n-channel transistor, leaving a parasitic diode from the other of the source or drain terminals to the substrate terminal of the n-channel transistor; the parasitic diode allowing a current to pass in a second direction relative to the source/drain terminals of the n-channel transistor when forward biased; and the n-channel transistor and the p-channel transistor connected such that the first direction is opposite to the second direction.

13. A SEU hardening circuit according to claim 12, wherein:

the source of the p-channel transistor is coupled to the second terminal of the SEU hardening circuit;

the source of the n-channel transistor is coupled to the first terminal of the SEU hardening circuit;

the drain of the n-channel transistor is connected to the drain of the p-channel transistor;

the substrate terminal of the p-channel transistor is coupled to the drain terminal of the p-channel transistor, leaving a parasitic diode from the source terminal to the substrate terminal of the p-channel transistor; the parasitic diode allowing a current to pass from the source terminal to the substrate of the p-channel transistor when forward biased; and the substrate terminal of the n-channel transistor is coupled to the source terminal of the n-channel transistor, leaving a parasitic diode from the substrate of the n-channel transistor to the drain; the parasitic diode allowing a current to pass from the substrate to the drain of the n-channel transistor when forward biased.

14. A SEU hardening circuit according to claim 12, wherein:

the source of the p-channel transistor is coupled to the second terminal of the SEU hardening circuit;

the source of the n-channel transistor is coupled to the first terminal of the SEU hardening circuit;

the drain of the n-channel transistor is connected to the drain of the p-channel transistor;

the substrate terminal of the p-channel transistor is coupled to the source terminal of the p-channel transistor, leaving a parasitic diode from the drain terminal to the substrate of the p-channel transistor; the parasitic diode allowing a current to pass from the drain terminal to the substrate of the p-channel transistor when forward biased; and the substrate terminal of the n-channel transistor is coupled to the drain terminal of the n-channel transistor, leaving a parasitic diode from the substrate of the n-channel transistor to the source; the parasitic diode allowing a current to pass from the substrate to the source of the n-channel transistor when forward biased.

15. A SEU hardening circuit according to claim 12, wherein:

the source of the p-channel transistor is coupled to the first terminal of the SEU hardening circuit;

the source of the n-channel transistor is coupled to the second terminal of the SEU hardening circuit;

the drain of the n-channel transistor is connected to the drain of the p-channel transistor;

the substrate terminal of the p-channel transistor is coupled to the source terminal of the p-channel transistor, leaving a parasitic diode from the drain terminal to the substrate of the p-channel transistor; the parasitic diode allowing a current to pass from the drain terminal to the substrate of the p-channel transistor when forward biased; and the substrate terminal of the n-channel transistor is coupled to the drain terminal of the n-channel transistor, leaving a parasitic diode from the substrate of the n-channel transistor to the source; the parasitic diode allowing a current to pass from the substrate to the source of the n-channel transistor when forward biased.

16. A SEU hardening circuit according to claim 12, wherein:

the source of the p-channel transistor is coupled to the first terminal of the SEU hardening circuit;

the source of the n-channel transistor is coupled to the second terminal of the SEU hardening circuit;

the drain of the n-channel transistor is connected to the drain of the p-channel transistor;

the substrate terminal of the p-channel transistor is coupled to the drain terminal of the p-channel transistor, leaving a parasitic diode from the source terminal to the substrate terminal of the p-channel transistor; the parasitic diode allowing a current to pass from the source terminal to the substrate of the p-channel transistor when forward biased; and the substrate terminal of the n-channel transistor is coupled to the source terminal of the n-channel transistor, leaving a parasitic diode from the substrate of the n-channel transistor to the drain; the parasitic diode allowing a current to pass from the substrate to the drain of the n-channel transistor when forward biased.

17. A SEU hardening circuit for use with a storage cell, wherein the storage cell includes a pair of cross-coupled inverters, the SEU hardening circuit having a first terminal and a second terminal, the first terminal connected to an output of one of the cross-coupled inverters, and the second terminal connected to an input of the other one of the cross-coupled inverters, the SEU hardening circuit comprising:

a voltage divider having a first terminal and a second terminal, the first terminal connected to the first terminal of the SEU hardening circuit, and the second terminal connected to the second terminal of the SEU hardening circuit, the voltage divider also having a tap terminal for providing an intermediate voltage;

a p-channel transistor with a source terminal, a drain terminal, a gate terminal and a substrate terminal;

an n-channel transistor with a source terminal, a drain terminal, a gate terminal and a substrate terminal;

the source terminal of the n-channel transistor being electrically connected to the first terminal of the voltage divider, the drain terminal of the n-channel transistor being electrically connected to the tap terminal of the voltage divider;

the source terminal of the p-channel transistor being electrically connected to the second terminal of the voltage divider, the drain terminal of the p-channel transistor being electrically connected to the tap terminal of the voltage divider; and the gate terminals of the n-channel transistor and the p-channel transistor being driven high and low, respectively, when the pair of cross-coupled inverters are to be written.

18. A SEU hardening circuit according to claim 17, wherein the substrate terminal of the n-channel transistor is electrically connected to the first terminal of the voltage divider, and the substrate terminal of the p-channel transistor is electrically connected to the tap terminal of the voltage divider.

19. A SEU hardening circuit according to claim 17, wherein the substrate terminal of the p-channel transistor is electrically connected to the second terminal of the SEU hardening circuit, and the substrate terminal of the n-channel transistor is electrically connected to the tap terminal of the voltage divider.

20. A SEU hardening circuit for use with a storage cell, wherein the storage cell includes a pair of cross-coupled inverters, the SEU hardening circuit having a first terminal and a second terminal, the first terminal connected to an input of one of the cross-coupled inverters, and the second terminal connected to an output of the other one of the cross-coupled inverters, the SEU hardening circuit comprising:

a voltage divider having a first terminal and a second terminal, the first terminal connected to the first terminal of the SEU hardening circuit, and the second terminal connected to the second terminal of the SEU hardening circuit, the voltage divider also having a tap terminal for providing an intermediate voltage;

a p-channel transistor with a source terminal, a drain terminal, a gate terminal and a substrate terminal;

an n-channel transistor with a source terminal, a drain terminal, a gate terminal and a substrate terminal;

the source terminal of the n-channel transistor being electrically connected to the first terminal of the voltage divider, the drain terminal of the n-channel transistor being electrically connected to the tap terminal of the voltage divider;

the source terminal of the p-channel transistor being electrically connected to the second terminal of the voltage divider, the drain terminal of the p-channel transistor being electrically connected to the tap terminal of the voltage divider; and the gate terminals of the n-channel transistor and the p-channel transistor being driven high and low, respectively, when the pair of cross-coupled inverters are to be written.

21. A SEU hardening circuit according to claim 20, wherein the substrate terminal of the n-channel transistor is electrically connected to the first terminal of the voltage divider, and the substrate terminal of the p-channel transistor is electrically connected to the tap terminal of the voltage divider.

22. A SEU hardening circuit according to claim 20, wherein the substrate terminal of the p-channel transistor is electrically connected to the second terminal of the SEU hardening circuit, and the substrate terminal of the n-channel transistor is electrically connected to the tap terminal of the voltage divider.

* * * * *